United States Patent [19]

Lehmann

[11] Patent Number: 4,525,769
[45] Date of Patent: Jun. 25, 1985

[54] EQUIPMENT BOX FOR A POWER CONVERTER ARRANGEMENT

[75] Inventor: Kjeld Lehmann, Sonderborg, Denmark

[73] Assignee: Danfoss A/S, Nordborg, Denmark

[21] Appl. No.: 590,445

[22] Filed: Mar. 16, 1984

[30] Foreign Application Priority Data

Apr. 9, 1983 [DE] Fed. Rep. of Germany ....... 3312810

[51] Int. Cl.³ ............................................. H05K 7/20
[52] U.S. Cl. .................................... 361/386; 361/384; 361/429; 165/122; 220/6
[58] Field of Search ........................ 363/141; 220/6, 7; 206/328, 334; 165/122; 174/15 R, 16 R, 16 HS; 361/382, 383, 384, 380, 399, 386, 390, 388, 389, 412, 395, 415, 429

[56] References Cited

U.S. PATENT DOCUMENTS

| Re. 29,371 | 8/1977 | De Bortoli | 361/428 |
|---|---|---|---|
| 3,407,869 | 10/1968 | Staunton | 361/383 |
| 3,909,678 | 9/1975 | Rifkin | 174/15 R |
| 4,240,646 | 12/1980 | Scott | 220/7 |
| 4,327,398 | 4/1982 | Chistison | 165/122 |
| 4,459,638 | 7/1984 | Brehm | 361/384 |

Primary Examiner—G. P. Tolin
Attorney, Agent, or Firm—Wayne B. Easton

[57] ABSTRACT

The invention relates to an equipment box for a power converter which includes a rear wall with vertical cooling ribs on the outside and having a planar surface on the insides upon which electrical components can be mounted. The box further has base, top and side walls and at least one conductor plate arranged on a component carrier which is pivotally mounted internally of the box. The side walls are pivoted to the rear wall by hinges, formed by a vertical groove on one wall and a rib engaged therein on the other wall. In this construction use is made of the fact that the rear wall with its cooling ribs constitutes a very stiff constructional element. The side walls can be mounted on it directly and, by reason of the pivotable arrangement, the side walls can be accurately positioned to be at right-angles to the rear wall. In this position they are then fixed by the retaining wall and tolerance variations which are unavoidable in walls of large area will not lead to stresses in the finished housing.

11 Claims, 5 Drawing Figures

EQUIPMENT BOX FOR A POWER CONVERTER ARRANGEMENT

The invention relates to an equipment box for a power converter arrangement, comprising a rear wall with vertical cooling ribs on the outside and having blocks with semi-conductor elements mounted on the inside, further comprising base, top and side walls and at least one conductor plate arranged on a carrier in front of the blocks, the carrier preferably being pivotable like a door.

In a known equipment box of this kind (DE-OS No. 28 05 019), which serves to receive the power converter arrangement for the drive of a machine tool, power-consuming semi-conductor elements are arranged in thermally conductive blocks which are connected directly to the planar mounting face of the rear wall which is likewise a good thermal conductor. In this way, the heat generated during operation can be properly dissipated to the outside to avoid impermissible heating. The rear wall, bottom wall, top wall and side walls are shown as a one-piece housing which can be closed at the front by a door covering the entire front opening. The door carries a plurality of conductor plates with the necessary electronics for operating the power converter. The production of such a box is expensive, especially if it is to be an encapsulated construction.

It is known (DE-OS No. 19 37 289) to assemble cupboards for electric installations from individual components. A frame is first assembled from individual parts. The walls can then be placed thereon as cladding elements. This manner of assembly is likewise expensive and hardly viable for encapsulated equipment boxes.

The invention is based on the problem of providing an equipment box of the aforementioned kind which consists of few main parts, can be easily assembled and is particularly suitable for encapsulated embodiments.

This problem is solved according to the invention in that the side walls are pivoted to the rear wall by hinges, that the hinges are each formed by a vertical groove on one wall and a rib engaged therein on the other wall, and that at least one horizontally extending retaining wall is connected to the rear wall, with the aid of which the position of both side walls is fixed.

In this construction, use is made of the fact that the rear wall with its cooling ribs constitutes a very stiff constructional element. The side walls can be mounted on it directly. By reason of the pivotable arrangement, the side walls can be accurately positioned to be at right-angles to the rear wall. In this position they are then fixed by the retaining wall. In this way, tolerance variations which are unavoidable in walls of large area will not lead to stresses in the finished housing. Assembly is rapid. The size of the box can be readily adapted to particular circumstances by selecting suitable wall sizes. Only a few parts need to be assembled. In particular, the side walls may also be parts of an encapsulated housing.

It is particularly favourable if the hinge is a plug hinge in which the rib in one assembly position of the side wall can be plugged into the longitudinal opening of the groove and, after pivoting the side wall, is secured in the groove against falling out. During assembly, therefore, the side wall need merely be connected to the rear wall by a plug connection and subsequently swung to reach the end position.

Preferably, the retaining wall is formed by the base and/or top wall and comprises retaining means which engage over the retaining elements at the side walls in the vertical direction. To locate the side walls, it is therefore only necessary to offer the base and/or top wall from below or from above. By reason of the double function of the base and top wall, the number of parts is small. Particularly in the case of encapsulated equipment, the base and/or top wall can be made especially strong.

In particular, each retaining element may consist of a vertical pin applied to a vertical inner strut and each retaining means may consist of a pin-receiving opening with a lateral slot for the passage of the inner strut. This construction results in a secure fixing without the need for tools.

Further, the base, top and side walls may have abutment faces for a front plate and the retaining means and retaining element may be arranged near the abutment faces. These abutment faces will then lie in one plane, even if considerable tolerances have to be taken into account, so that the front plate can be inserted closely.

The retaining wall may also or in addition be formed by an upper and/or lower frame which is secured at the back to the rear wall and at the side forms an abutment face for the side walls. Such a frame can be positively applied to the stiff back wall. If it comprises lateral means for securing the side walls, additional stiffening is obtained.

Even the base or top wall may be secured to the frame. A direct connection to the rear wall is then omitted, which, again, is an advantage for reasons of tolerance.

It is particularly favourable if the frames comprise flanged rear and/or side portions with screw holes and the rear and/or side walls have on the inside vertical grooves with a cross-sectional enlargement for receiving a nut. Such frames are inherently very stiff and can be positively secured to the walls at any desired height. It is even possible with the aid of such frames to construct encapsulated equipment boxes or, if the base, top and side walls are omitted, open constructions.

The side portions of the upper and lower frames can be interconnected at the front ends by side struts. This provides still higher strength.

Advantageously, the rear wall and side walls are extruded profiles. This is possible because not only the cooling ribs, which may also be applied to the side wall, are parallel to each other but also because the connecting means as described (hinge groove, hinge rib, inner strut with pin, grooves for receiving nut) can be throughgoing. The height of the equipment box can therefore be easily determined by selecting the length of the extruded profile.

Another possibility of changing the size of the box resides in the rear wall consisting of a plurality of parallel juxtaposed profiles interconnected to form a unit by means of the upper and lower frames. By using fewer or more profiles, the width of the equipment box can be very easily varied. This merely requires different frames and top or base walls.

Seals are preferably placed between adjacent wall portions. These seals permit tolerance differences to be balanced out and result in a water-tight equipment box.

According to another aspect of the invention, assembly of the equipment box is facilitated in that the carrier of the conductor plate that can be pivoted like a door is mounted in bearings at an upper and lower frame connected at the back to the rear wall and that the pivotal axis of the carrier is displaceable in relation to the frames. By displacing the pivotal axis, the carrier can be brought to a selected position during assembly or repair of the electrical components, particularly the blocks at the rear wall, so that all parts of the box interior are easily accessible.

For this purpose, the bearings may be adjustable on the frames, whether by displacement or pivoting.

In a preferred embodiment, at least two bearings releasably receiving pins on the carrier are provided at a spacing from each other at the front of the frames. To provide good access, the carrier is simply released from one bearing and suspended in another bearing.

From a constructional point of view, each bearing may be formed by an incision extending from the front of the frame and a spring-loaded locking element which is provided with an actuating member and retains the pin in the incision. In particular, the locking element is a leaf spring which covers the incision, has an opening for the passage of the pin, and projects beyond the frame with a flanged portion. By bending the leaf spring away, the pins can be pulled out of the incisions. When pushing into the incisions, the pins automatically push the leaf spring out of the way.

In conjunction with the encapsulated equipment box as described but also in conjunction with other encapsulated equipment boxes, it is desirable for a front plate to abut closely to the base, top and side walls in front of the carrier that can be pivoted like a door. To produce air circulation through at least one opening in the carrier, a fan may be applied to the latter. In this way, good cooling is achieved despite the encapsulation because the interior air will also be forced to pass the front plate and therefore undergo additional cooling.

It is in this case preferable for the carrier to be disposed at a lateral spacing from the side walls. In conjunction with the fan, this will result in a clearly defined circulating path.

It is also favourable for the cooling ribs at the rear wall to be sealed by a vertical channel profile which leaves an inlet cross-section free between the cooling ribs at the lower end. Heat is dissipated through the chimney effect.

A fan may be applied to the top of the equipment box and possess a suction chamber above the cooling ribs. The suctioneffect results in a uniform air current in the individual passages formed between the cooling ribs.

Preferred examples of the invention will now be described in more detail with reference to the drawing wherein.

Figure 1:
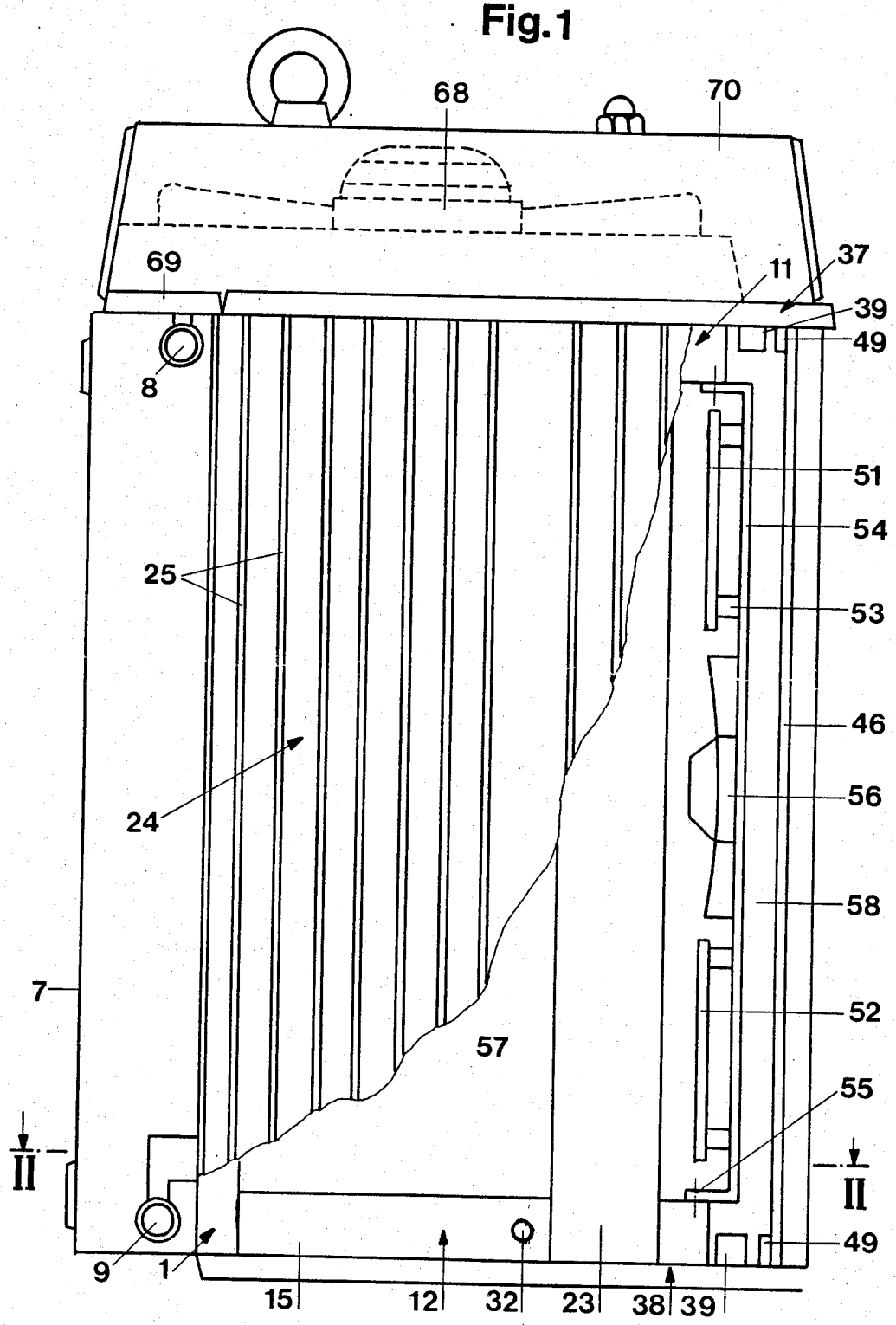
FIG. 1 is a side elevation of an equipment box according to the invention, the front side wall being partly broken away.

The equipment box of FIG. 1 comprises a rear wall 1 which is provided at the back with cooling ribs 2 and at the front has a planar mounting face 3 to which blocks (not shown) with semi-conductor elements can be applied. The rear wall 1 consists of a plurality of juxtaposed profiles 4 and 5 which abut with the interpositioning of a seal 6. A U-shaped channel profile 7 is applied to the rear wall by screws 8 and 9 so that the passages 10 remaining between the cooling ribs 2 are substantially closed.

Figure 2:
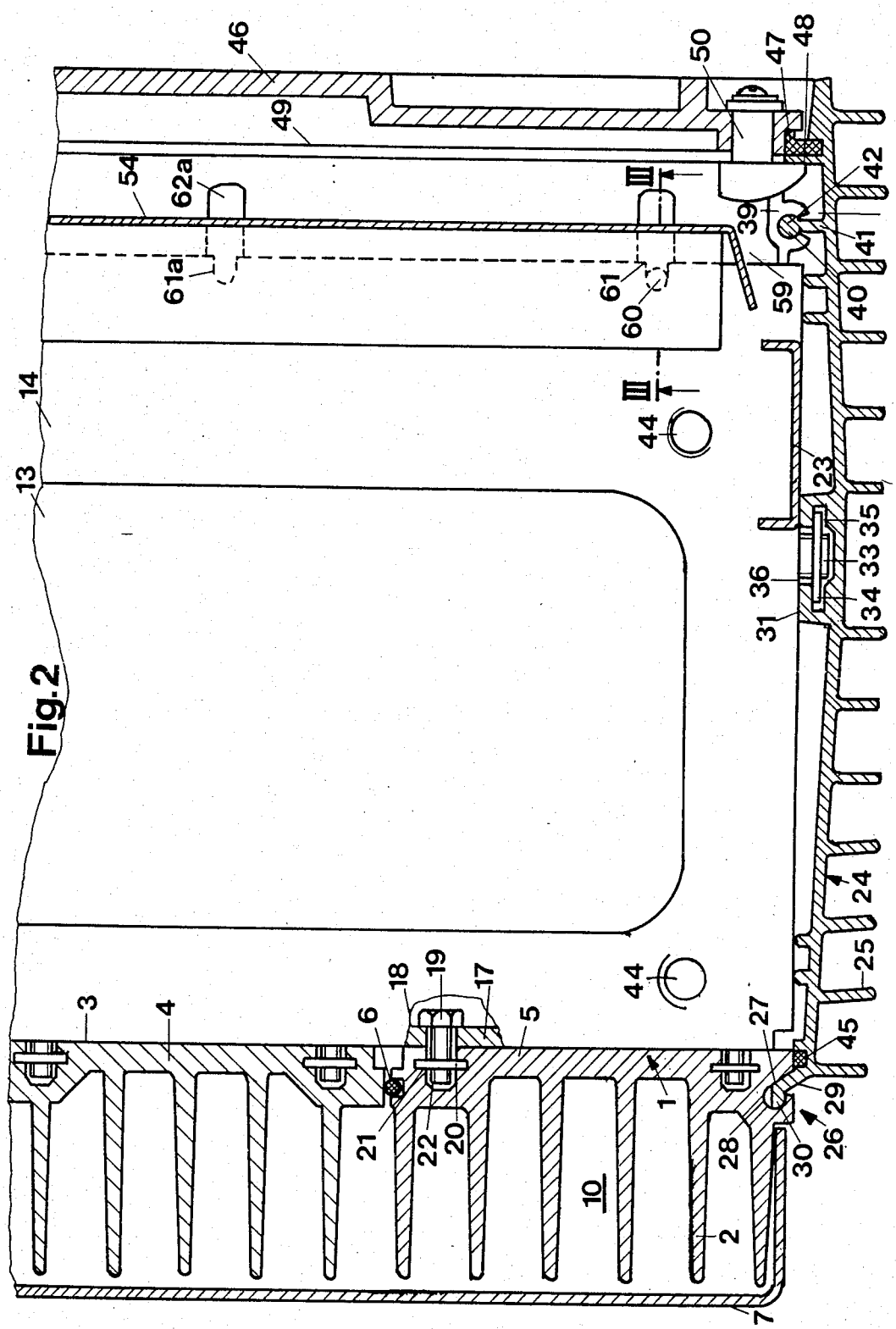
FIG. 2 is a part-section at the level of the line II—II in FIG. 1.
Figure 3:
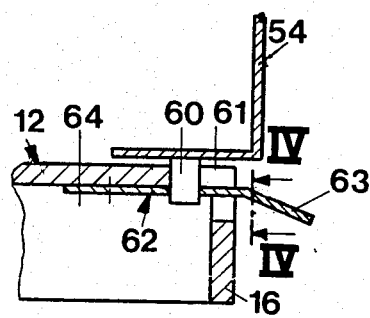
FIG. 3 is a part-section along the line III—III in FIG. 2.
Figure 4:
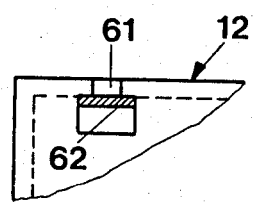
FIG. 4 is an elevation along the line IV—IV onto the console of FIG. 3.

The profiles of the rear wall are connected to form a unit by means of an upper frame 11 and a lower frame 12. The frames have a main surface 14 provided with a recess 13 and vertically flanged peripheral faces, namely side portions 15 (FIG. 1), a front portion 16 (FIG. 3) and a rear portion 17 (FIG. 2). The rear portion 17 comprises holes 18 for the passage of screws 19 which engage in nuts 20 guided in cross-sectional enlargements 21 of grooves 22 at the rear wall 1. The two frames 11 and 12 are interconnected by side struts 23.

Two side walls 24 carrying cooling ribs 25 on the outside and consisting of extruded profiles as does the rear wall 1 are connected to the rear wall 1 by a plug hinge 26. For this purpose, a groove 27 is provided in the rear wall and has an enlargement which is circular in cross-section. The side wall 24 carries a rib 29 with a flanged end piece 30. When aligned with the groove 27, this end piece can simply be pushed into the enlargement 28. The side wall 24 can thereafter be swung to the illustrated end position like a door. The end position is defined by the fact that abutment faces 31 at the side wall 24 strike the side portions 15 of frames 11 and 12. In this position, the side wall can, with the aid of screws 33 passing through apertures 32 in the side portions 15, be held to nuts 34 inserted in a cross-sectional enlargement 35 of groove 36. Instead, or in addition, the side walls 24 can also be located in position with the aid of a top wall 37 and a base wall 38 which for this purposes comprise retaining means 39 that project into the interior of the box and engage over vertically extending retaining elements. As is shown in FIG. 2, the latter consist of a pin which extends over the entire height of the side wall and is held by an inner strut 41. The retaining means comprise a pin-receiving opening 42 with a lateral slot 43 for the passage of the inner strut 41. The top wall 37 and base wall 38 are secured to the adjacent frame 11 or 12, namely by means of screws engaging in tapped holes 44. Sealing cords may be placed between the rear wall 1 and the side walls 24 on the one hand and the top wall 37 or base wall 38 on the other hand, these cords corresponding to the sealing cord 6 between the profiles 4, 5 of rear wall 1 or the seal 45 between the side wall 24 and rear wall 1. A front plate 46 can be pressed against abutment faces 48 at the side walls and abutment faces 49 at the base or top wall with the interpositioning of a seal 47. For this purpose, rotary closures 50 are provided which engage behind the abutment faces 48 of the side walls. The abutment faces 48 and 49 are accurately aligned with each other because the retaining means 39 and the retaining elements 40 are disposed near these abutment faces. Two conductor plates 51 and 52 carrying electronic components (not shown) are arranged by way of spacers 53 on a carrier 54 which is arranged at a slight spacing behind the front plate 46 and can swing about an axis 55 like a door. The carrier is also provided with a fan 56 above a complementary opening for conveying air from the interior 57 behind the carrier 54 into the chamber 58 between the carrier and front plate, where the air is additionally cooled by the front plate 45. The return path is by way of a gap 59 between the carrier 54 and side wall 24 so that further forced cooling takes place at the side wall.

For mounting purposes, the carrier 54 comprises an upper and a lower pin 60. The pins 60 engage incisions 61 at the front edges of frames 11 and 12 and continue in the front faces 16 of the frames, an incision for the lower frame being shown in FIG. 3. A leaf spring 62 having a front flange portion 63 and a rear end portion 64 is secured at its rear end portion 64 to the associate frame. By pressing the leaf springs 62, the pins 60 are released. Similar incisions 61a with a leaf spring 62a are disposed at different positions of the front edge of the frames. By depressing the leaf spring, the pin 60 can be removed from the incision 61. By simply pushing the pin 60 into another incision 61, during which time the front portion 63 of leaf spring 62 serves as a run-up ramp, the pivotal axis of the carrier can be brought to a different position. The hitherto poorly accessible parts in the interior of the equipment box can now be reached more easily.

Figure 5:
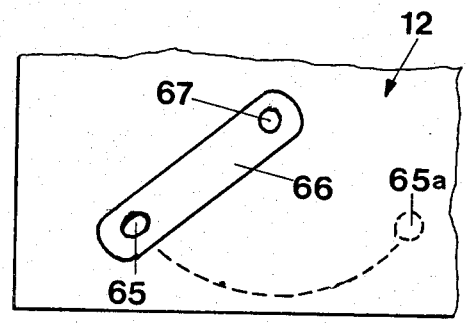
FIG. 5 is a modified embodiment of the bearing from above.

A different alternative is shown in FIG. 5. In that case, a bearing aperture 65 for the pin 60 is provided in a pivoted lever 66 which can be swung about a fulcrum 67 on the frame 12. Consequently, the bearing aperture 65 can be displaced to the position 65a.

On the cover 37 there is a fan 68 having a suction chamber 69 disposed above the cooling passages 10. The remaining interior of the equipment box is closed by the cover 37. Cooling air is therefore necessarily sucked through the cooling passages 10 and delivered upwardly. The entire arrangement is covered by a hood 70 having apertures.

The same arrangement can also be utilised as an open construction if the side walls 24, the top wall 37 and the base 38 are omitted and the side struts 23 project forwardly to such an extent that the front plate 46 can be applied thereto.

I claim:

1. An equipment box for a power converter unit, comprising, a rear wall, side walls and a front wall, said rear wall having vertical cooling ribs on the outside thereof and a planar mounting surface on the inside thereof, a horizontally extending base member and a horizontally extending top member mounted by said rear wall, said base and top members fixing the positions of said side walls, a carrier member hingedly mounted by said base and top members for pivotal movement about a vertical axis between the front and rear walls, plate means removably mounting components on said carrier member in spaced relationship thereto, said side walls and rear wall having plug hinge means pivotally connecting said side walls to said rear wall, said hinge means, in each side wall including a vertical groove formed in one of the respective side wall and the rear wall and a rib formed on the other of the side wall and rear wall that is plugged into the groove and pivoted to abut against at least one of the base and top members.

2. An equipment box according to claim 1 wherein retaining means are provided between at least one of said base and top members the side walls for retaining the side walls in fixed positions relative to the base and top members, said retainer means including a retainer member on each of said side walls and a retainer element on one of said base and top members for each retainer member that vertically engage the retainer members, each retainer element including a vertical pin and a vertical strut for joining the pin on the respective side wall and each retainer member having a vertical pin receiving opening and a lateral slot opening to the vertical opening for passage of the respective strut.

3. An equipment box according to claim 1 wherein said base and top members and said side walls have first abutment faces, said front wall having second abutment faces engaging said first abutment faces and fastened thereto, and said retaining means being positioned near said abutment faces.

4. An equipment box according to claim 1 wherein said base and top members include upper and lower frame members and a base and a top wall secured to the upper and lower frame members respectively, said upper and lower frame members being mounted by said rear wall and having side portions forming faces for said side walls.

5. An equipment box according to claim 4 wherein said frame members include lateral means for securing said side walls.

6. An equipment box according to claim 1 wherein said rear and side walls are extruded profiles.

7. An equipment box according to claim 4 wherein said rear wall consists of a plurality of parallel profiles connected by said upper and lower frame members to form a unit.

8. An equipment box according to claim 4 wherein said pivotal movement of said carrier member is effected by bearing means between said carrier member and said upper and lower frame members.

9. An equipment box according to claim 8 wherein said bearing means includes at least two spaced bearings releasably receiving pin means on said carrier member.

10. An equipment box according to claim 8 wherein said bearing means is formed by an incision extending from the front of said lower frame member and a spring loaded locking element which retains said pin means in said incision and is provided with an actuating member.

11. An equipment box according to claim 10 wherein said locking element is a leaf spring which covers the incision and has an opening receiving said pin means, said locking element having a flanged portion which projects beyond said lower frame member.

* * * * *